(12) United States Patent
Miyamoto et al.

(10) Patent No.: US 6,271,540 B1
(45) Date of Patent: Aug. 7, 2001

(54) THIN FILM TRANSISTOR WITH SILICON OXYNITRIDE FILM AND SILICON NITRIDE CHANNEL PASSIVATION FILM FOR PREVENTING A BACK CHANNEL EFFECT AND A METHOD FOR FABRICATING THE SAME

(75) Inventors: Takashi Miyamoto, Yokohama; Takatoshi Tsujimura, Fujisawa, both of (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/301,933

(22) Filed: Apr. 29, 1999

(30) Foreign Application Priority Data

May 1, 1998 (JP) .................................... 10-121943

(51) Int. Cl.[7] .................................... H01L 21/00
(52) U.S. Cl. .............. 257/59; 257/72; 257/347; 257/158; 257/159
(58) Field of Search .................... 438/158, 159; 257/72, 59, 347

(56) References Cited

U.S. PATENT DOCUMENTS

| | | | |
|---|---|---|---|
| 5,500,380 | * | 3/1996 | Kim ..................................... 437/409 |
| 5,874,326 | * | 2/1999 | Lyu ..................................... 438/158 |
| 6,011,274 | * | 1/2000 | Gu et al. ............................. 257/59 |
| 6,107,640 | * | 8/2000 | Park et al. .......................... 257/59 |

\* cited by examiner

*Primary Examiner*—Fetsum Abraham
(74) *Attorney, Agent, or Firm*—Robert M. Trepp

(57) ABSTRACT

The present invention provides a thin film transistor (TFT) and a fabrication method thereof which suppresses the back channel effects in which a leakage current flows between a source electrode and a drain electrode at times during a turn off state of the TFT. A thin silicon oxynitride film 90 having a thickness preferably equal to or less than 50 Å is formed between an amorphous silicon layer 40 and a channel passivation film 50 (a silicon nitride film) above a back channel region 100 between a source electrode and a drain electrode of an inverted staggered type TFT to cause Si—O bonds to exist in an upper interface of the amorphous silicon layer. The Si—O bonds increase the Density of States in the back channel region and has an effect for suppressing the leakage current through the back channel region 100 at times during the turn off of the TFT.

8 Claims, 5 Drawing Sheets

THIN FILM TRANSISTOR WITH SILICON OXYNITRIDE FILM AND SILICON NITRIDE CHANNEL PASSIVATION FILM FOR PREVENTING A BACK CHANNEL EFFECT AND A METHOD FOR FABRICATING THE SAME

FIELD OF THE INVENTION

The present invention relates to a method for fabricating an inverted staggered type thin film transistor with a high reliability using an amorphous silicon and a structure of the thin film transistor. More particularly, the present invention relates to a method for fabricating an inverted staggered type thin film transistor with a high reliability, which can prevent an undesired back channel effect, in which a channel is turned on during an off state of the thin film transistor to cause a leakage current, and relates to a structure of the thin film transistor. Further, the present invention relates to a method for fabricating a thin film transistor which can control a threshold voltage $V_{Fth}$ of a front channel.

BACKGROUND OF THE INVENTION

Thin film transistors (TFTs) using an amorphous silicon (a-Si) have been used in a large size image sensor or in a large size liquid crystal display (LCD) since the TFTs can be formed on a large size substrate. A practical technology has been established for mounting a plurality of TFTs on a glass substrate as switching elements of picture elements (PELs) of a LCD.

The TFT is classified into a normally staggered type and an inverted staggered type depending upon the order of stacking various thin films on the substrate. In the normally staggered type TFT, a source electrode and a drain electrode are initially formed on the substrate, and a gate electrode is finally formed. In the inverted staggered type TFT, the gate is initially formed on the substrate, and the source electrode and the drain electrode are finally formed. The inverted staggered type TFT of these two types of TFTs has been frequently used in the LCD due to its easiness of fabrication and a stability of operational characteristics. In the inverted staggered type TFT, the gate electrode exists below a gate insulating film, and the source electrode and the drain electrode exist above the gate insulating film and are exposed to an external atmosphere, as shown in FIGS. 1C, 2D and 3D. Two fabrication methods of the inverted staggered type TFT are shown in the FIGS. 1A–1C and 2A–2D. FIGS. 1A–1C show the fabrication method of a channel etch type TFT 1, and the FIGS. 2A–2D show the fabrication method of a channel passivation type TFT 2.

In a Japanese Published Examined Patent Application 6-9246 and a Published Unexamined Patent Application 7-114285, for example, the fabrication method of the inverted staggered type TFT of the channel etch type is described as a prior technology. In a first step (a) shown in FIG. 1A, a structure is prepared in which, after a gate electrode 20 is patterned on a glass substrate 10, a gate insulating film 30, such as a silicon oxide film or a silicon nitride film, an amorphous silicon (a-Si) layer 40 of an order of a thickness of about 2000 Å and a n+a-Si film 70 as a low resistive film are sequentially stacked. In a step (b) shown in FIG. 1B, the patterns of the source and drain electrodes 80 is formed. Finally, in a step (c) shown in FIG. 1C, a portion of the n+a-Si layer 70 above a back channel region 100 of the a-Si layer 40 is removed by a reactive ion etching (RIE) process using the source and drain electrodes as a mask. During this etching, an upper interface of the a-Si layer 40 is partially removed. By using this fabrication method, the TFT array for the LCD in which a plurality of TFTs 1, as shown in the step (c), are formed is obtained.

However, a problem is caused in the fabrication method using the channel etching, that the channel region is damaged by an impact of the ions in the etching process. The impact of the ions in the etching process shown in FIG. 1C damages a front channel region 110 (an interface of the gate insulating film 30/the a-Si layer 40) and its electric characteristics, so that the stability of the TFT characteristics and a reliability of quality are degraded. To solve the damage to the front channel region 110 in the etching step (c), it can be considered to use the a-Si layer 40 of a thickness about 2000 Å. However, this thickness of the a-Si layer 40 is four or five times of a thickness (~500 Å) of an a-Si layer of a channel passivation film type TFT shown in the FIG. 2D, later described. Accordingly, a parasitic serial resistance having a value of several times of a contact resistance of the normal TFT exists between the source and the drain, so that a voltage normally applied to the PEL electrode can not provide a sufficient conduct characteristics during the turn on of the TFT. In the case that the channel etching type TFT 1 is used as the switching element of the LCD, a large size TFT is required to realize a sufficient write current. The use of the large size TFT in the PEL portion of the LCD causes an aperture ratio indicating a performance of the LCD to be decreased. The LCD panel comprises the area of PELs (the apertures through which the light passes) and the area of the other components. The aperture ratio is the ratio of the area of the PELS to the entire area of the LCD panel. The larger the aperture ratio is, the higher is the luminance of the display image of the LCD, so that a clear image is displayed and a large power saving effect is obtained. Usual LCD has the aperture ratio of 50~70%. In the case that the channel etching type TFT 1 is used as the switching element of the LCD, the large size TFT should be formed for each of the PELs to maintain a sufficient write current. As a result, the area of the TFT becomes large, so that the aperture ratio of the LCD panel using the TFTs is decreased.

In contradistinction to the TFT 1 fabricated by the channel etching process, the channel passivation film type TFT 2 shown in the FIG. 2D does not require the protection of the front channel region 110 from the damage applied in the etching process. The thickness of a-Si layer 40 of the usual channel passivation film type TFT 2 may be on the order of only about 500 Å. The thickness of the a-Si layer of the channel passivation film type TFT 2 is sufficiently thinner than the thickness of the a-Si layer of the channel etching type TFT 1 shown in the FIG. 1C, the problem of decreasing the aperture ratio is solved in the structure of the channel passivation film type TFT 2. Describing the fabrication method of the channel passivation film type TFT 2, in step (a) shown in FIG. 2A, a structure is prepared in which, after the gate electrode 20 is patterned on the glass substrate 10, the gate insulating film 30, such as the silicon oxide film or the silicon nitride film, the a-Si layer 40 may have a thickness of about 500 Å, and a silicon nitride film as a channel passivation layer 50 are sequentially stacked. In step (b) shown in FIG. 2B, the channel passivation layer 50 is patterned by using a resist mask pattern 60 formed above the gate electrode 20. In step (c) shown in FIG. 2C, the resist mask pattern 60 is removed, and a low resistive film 70 of the a-Si doped with the N type dopants is formed on the entire surface. In final step (d) shown in FIG. 2D, the patterns of the source and the drain electrode 80 are formed with respect to the gate electrode 20. A portion of the low resistive film (the n+a-Si) 70 above the back channel region 100 is etched by using the source and drain electrodes 80 as the mask, whereby the inverted staggered type TFT 2 in which the channel is protected by the passivation film is completed. In the Japanese Published Examined Patent Application 6-9246, one of the fabrication methods of the inverted staggered type TFT of the channel passivation film type is described.

In the channel passivation film type TFT 2 shown in the FIG. 2D, the channel passivation film 50 (for example the silicon nitride film) is continuously formed on the a-Si layer 40 in the step (a). When the a-Si layer 40 and the silicon nitride film 50 are continuously formed, the formation of lattice defects, to which the charges are putting in and out in an interface, between the a-Si layer 40 and the silicon nitride film 50 is suppressed. That is, a Density of States is small in an upper interface region (the back channel region) of the a-Si layer 40. In the case that the Density of States in the back channel region 100 is small, a consumption of a bias field for putting the electrons or the holes in and out the lattice defects is small in the back channel region 100. That is, in this structure, a leakage current tends to flow between the source electrode and the drain electrode by a small external electric field. Also, in the case that the Density of States is small, a scattering of the electrically conductive electrons and holes due to the lattice defects is also small. Accordingly, in the TFT2 in which the Density of States in the back channel region 100 is small, when the small back gate voltage 120 is applied to the turned off TFT, the leakage current flows between the source electrode and the drain electrode through the back channel region 100.

The case in the actual use of the LCD in which the back gate voltage 120 is generated at times during the off state of the TFT are, as follows. When impurity ions having the positive charges are placed on the TFT, or when the defects for generating the positive charges occur in the channel passivation film 50 of the TFT, the back gate voltage 120 is generated. Such phenomenon is called the back channel effects or the back gate effects in which, under the existence of such unexpected back gate voltage, an undesired and uncontrolled leakage current flows between the source electrode and the drain electrode through the back channel region 100 during the off state of the TFT. When the back channel effects occur during the off state of the TFT, the charges stored in a capacitor of each picture element of the LCD panel is discharged through the TFT, whereby the so called white strip occurs and the display quality is degraded.

As the method for preventing the back channel effects, the silicon oxide film has been used as the channel passivation film 50 in place of the silicon nitride film in step (a) shown in FIG. 2A. For example, the Japanese Published Unexamined Patent application 7-114285 discloses a method for fabricating the inverted staggered type TFT using the silicon oxide film as the channel passivation film. However, when the silicon oxide film is used as the channel passivation film 50, a mismatch between a lattice constant of the a-Si layer 40 and a lattice constant of the Si—O is large, whereby the defects tend to occur at the upper interface portion of the a-Si layer 40 even if the silicon oxide film is continuously formed on the a-Si layer 40. That is, the mismatch between the lattice constant of the a-Si layer and the lattice constant of the silicon oxide layer has an effect which causes the Density of States in the back channel region 100 to be large. However, since the capability for blocking ions which is required for channel passivation film 50 is low in the silicon oxide film, a new problem arises in that it passes impurity ions into the front channel region 110. Also, an etching rate of the silicon oxide film by a buffered hydrofluoric acid (HF) is very high, so that the control of the etching process in step (b) shown in FIG. 2B is difficult, resulting that the overhangs shown by dashed line in step (b) tend to occur. The channel lengths of the TFTs are widely scattered or varied by these overhangs. If the channel lengths of the TFTs used in the LCD are widely varied, the write operation is failed. Accordingly, in the case that the silicon oxide film is used as the channel passivation film 50, it is difficult to provide the TFTs with a reliable TFT characteristics and quality.

Accordingly, it has been required in the fabrication process of the channel passivation film type TFT shown in the FIG. 2D to suppress the back channel effects. Also, the fabrication process for realizing an easy control of the etching of the passivation film on the back channel region 100 of a-Si layer 40 in addition to the above requirement has been required to provide TFTs with reliable characteristics and quality.

It is one object of the present invention to provide a thin film transistor (TFT) and a fabrication method thereof which prevents the back channel effects in which the leakage current flows between the source electrode and the drain electrode during the off state of the TFT.

It is another object of the present invention to provide a fabrication method of the TFT for reducing the formation of the overhang in the channel passivation film on the a-Si layer in the etching process of the channel passivation film on the a-Si layer.

It is another object of the present invention to provide a fabrication method of the TFT which is capable of precisely controlling a threshold voltage $V_{Fth}$ of the front channel and suppressing the back channel effects in which the leakage current flows due to the undesired turn on of the back channel during the off state of the TFT.

It is another object of the present invention to provide a fabrication method of the TFT which is capable of precisely controlling a threshold voltage $V_{Fth}$ of the front channel.

SUMMARY OF THE INVENTION

The present invention forms a thin silicon oxynitride film having a thickness preferably equal to or less than 50 Å between a silicon layer and a channel passivation film above a back channel region between a source electrode and a drain electrode of an inverted staggered type TFT. The present invention prevents a leakage current due to the back channel effects to flow between the source electrode and the drain electrode by causing Si—O bonds to exist in an upper interface of the silicon layer to increase the Density of States in the back channel region. Since the thin silicon oxynitride film contains a large quantity of Si—N bonds, a small etching rate can be realized, whereby an easy control of the etching process can be obtained, resulting in the reliable inverted staggered type thin film transistor with a stabilized voltage-current characteristics.

A thin film transistor in accordance with the present invention includes a gate electrode, a gate insulating film, a silicon layer and source and drain electrodes formed on an insulating substrate in this order. A thin film transistor in accordance with the present invention includes a silicon oxynitride film formed on the silicon layer on a back channel region between the source electrode and the drain electrode, and a channel passivation film formed on the silicon oxynitride film.

A method for fabricating a thin film transistor in accordance with the present invention comprises the steps of: sequentially forming a gate insulating film, a silicon layer, a silicon oxynitride film and a channel passivation film in this order on an insulating substrate and a gate electrode formed on the insulating substrate; depositing a resist layer on the channel passivation film and forming a pattern of resist mask at a position above the gate electrode; etching portions of the channel passivation film and the silicon oxynitride film which are not covered by the resist mask; removing the resist mask; depositing a low resistive film on an entire surface of the structure; forming a source electrode and a drain electrode on the low resistive film at positions of both sides of the remaining channel passivation film; and removing a portion of the low resistive film which is placed on a back channel region between the source electrode and the drain electrode.

In the method for fabricating a thin film transistor in accordance with the present invention, a predetermined threshold voltage of a front channel can be realized by controlling a flow rate of $N_2$ in a mixed gas containing $SiH_4$, $N_2$ and $NO_2$ at the formation of the silicon oxynitride film by a chemical vapor deposition (CVD) method using the above mixed gas.

BRIEF DESCRIPTION OF THE DRAWING

These and other features, objects, and advantages of the present invention will become apparent upon consideration of the following detailed description of the invention when read in conjunction with the drawing in which.

DESCRIPTION OF THE PREFERRED EMBODIMENT

Figure 1A:
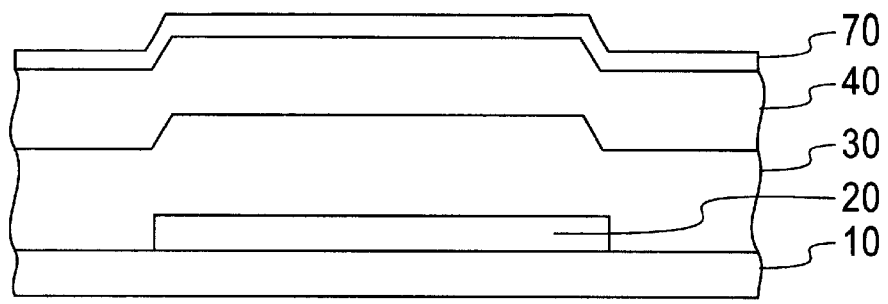
FIG. 1 shows a prior channel etch type TFT.
Figure 1B:
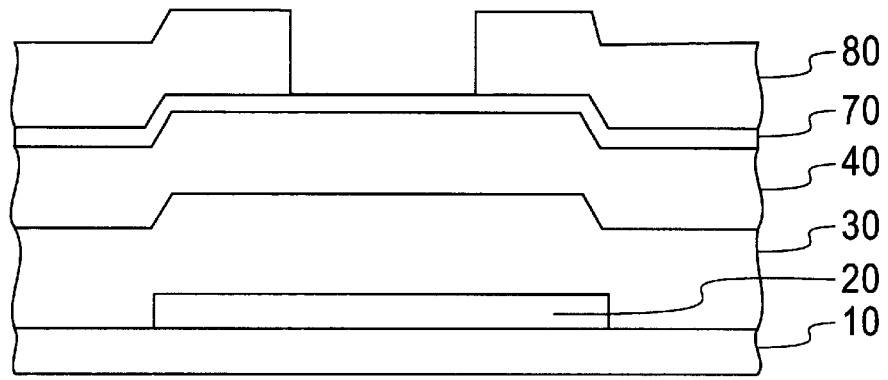
Figure 1C:
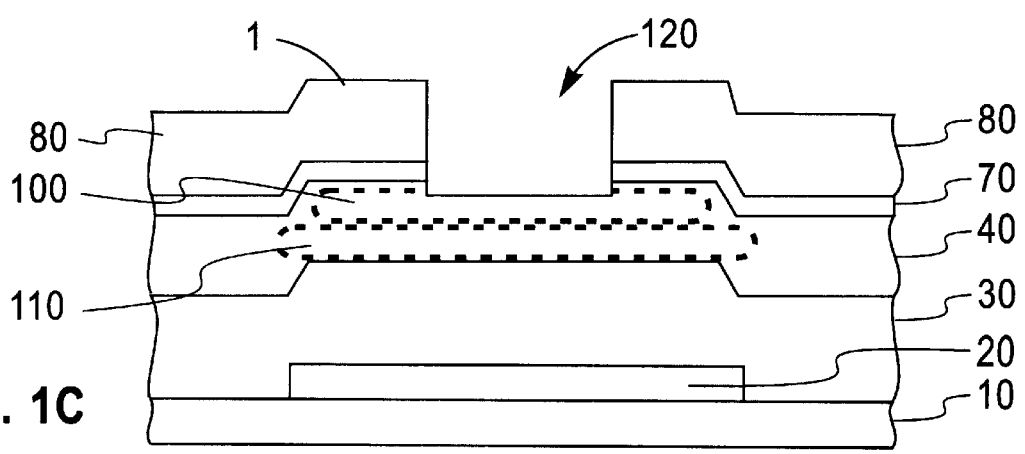

FIGS. 3A–3D show the steps of the fabrication method of the inverted staggered type TFT in accordance with the present invention. The fabrication method of the present invention solves the problems in the fabrication method of the prior channel passivation film type TFT shown in the FIGS. 2A–2D. In step (a) shown in the FIG. 3A, the pattern of a gate electrode 20 is formed on an insulating substrate 10, for example a glass, and a gate insulating film 30 is formed on the entire surface of the structure. A silicon layer 40 (for example an amorphous silicon (a-Si) layer), a thin silicon oxynitride film 90 and a channel passivation film or a channel stopper 50, for example a silicon nitride film are deposited on the structure in this order. The important points of the present invention in the step (a) are that the silicon oxynitride film 90 of the thin thickness is formed on the silicon layer 40, and the silicon oxynitride film 90 has Si—O bonds and Si-N bonds. The detail of the process for forming the silicon oxynitride film 90 is later described. It is desirable that the thickness of the silicon oxynitride film 90 has a thickness equal to or less than 50 Å for the channel passivation film 50 of the thickness of about 500 Å. The silicon nitride film 50 formed on the silicon oxynitride film 90 is formed by a plasma CVD using a mixed gas containing $NH_4$. For example, the mixed gas contains $SiH_4$, $N_2$, and $NH_4$. A large quantity of nitrogen are introduced into the underlying silicon oxynitride film 90 by the $NH_4$ plasma used for the formation of the silicon nitride film 50. Since the silicon oxynitride film 90 is thin, the N is entirely diffused into the film 90. That is, a large quantity of Si—N bonds are entirely distributed within the silicon oxynitride film 90.

Figure 3A:
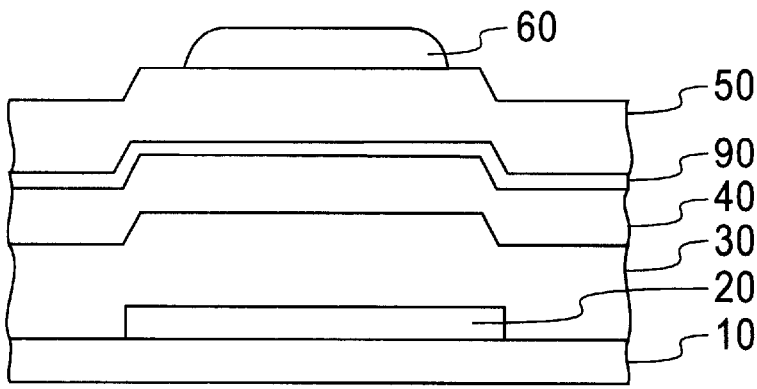
FIG. 3 shows a fabrication method of the channel passivation film type TFT in accordance with the present invention.
Figure 3B:
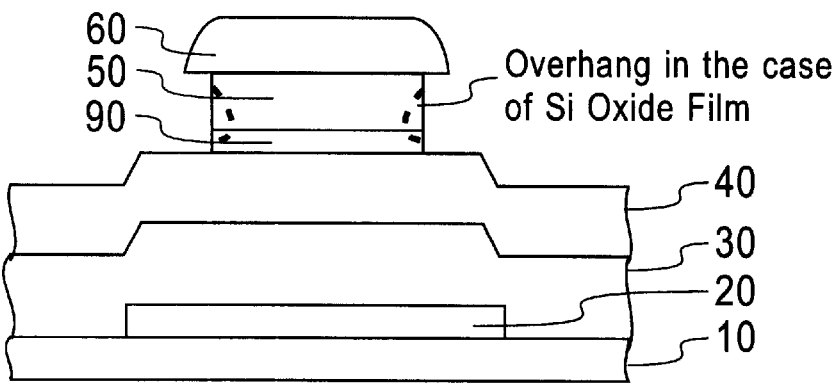

A resist pattern 60 is formed on the channel passivation film 50 at a position corresponding to the position of the gate electrode 20, and the process proceeds to step (b) shown in FIG. 3B. In step (b), by using the resist pattern 60, the channel passivation film 50 (the silicon nitride film) and the underlying silicon oxynitride film 90 are selectively etched by an etchant, such as a buffered hydrofluoric acid (HF). The formation of the films 50 and 90 containing a large quantity of Si—N bonds on the a-Si layer 40 causes the etching rate of these films 50 and 90 to be lower than the etching rate of the channel passivation film 50 formed of the silicon oxide film. That is, the control of the etching process (b) shown in FIG. 3B of the present invention is easier than that of the prior etching process of the FIG. 2B. Based upon this fact, the present invention replaces the thin portion of the silicon oxide film forming the channel passivation film above the back channel region 100 in the prior structure by the silicon oxynitride film 90 to prevent the formation of the overhangs shown by the dashed line which are formed in the prior structure. The etching rate of the films 50 and 90 in etching step (b) shown in FIG. 3B for exposing the surface of the a-Si layer 40 is determined or controlled by the etching rate of the silicon nitride film 50 since the silicon nitride film 50 is sufficiently thicker than the silicon oxynitride film 90, and the silicon nitride film 50 contains only Si—N bonds. In this manner, it is possible to precisely control the etching of the films 50 and 90 by forming the silicon oxynitride film 90 and the silicon nitride film 50 on the a-Si layer 40, whereby the undesired variation of the channel length of the TFT can be suppressed, and the TFT with the desired high quality can be realized. The first feature of the present invention is provide the TFT which has the reliable and stable TFT characteristics by using the structure which causes the precise control of the etching process.

Figure 3C:
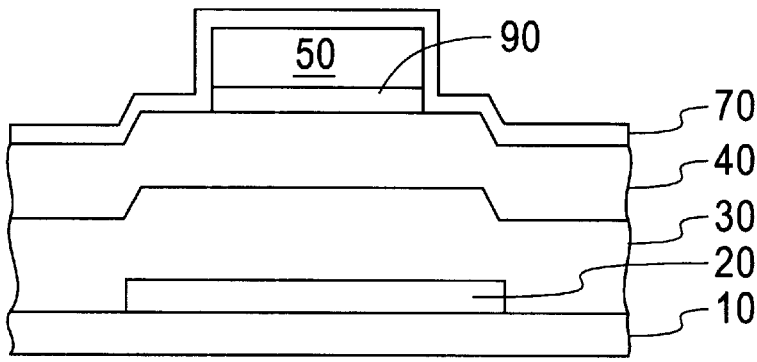
Figure 3D:
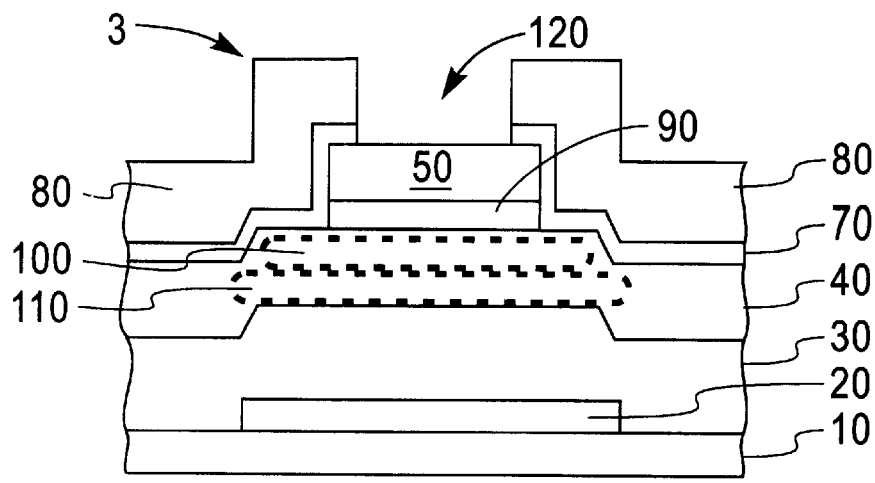

After the removal of the resist pattern 60, a low resistive film ($n^+$a-Si film) 70 is formed on the entire surface of the structure in the step (c) shown in FIG. 3C. In the final step (d) shown in FIG. 3D, the pattern of the source and drain electrodes 80 is formed, and a portion of the low resistive film 70 ($n^+$a-Si) above the back channel region 100 between the source electrode and the drain electrode is removed by the etching process using the source and drain electrodes 80 as the mask, so that the channel passivation film type TFT 3 is formed.

Oxygen are also contained in the silicon oxynitride film 90 in step (a). Accordingly, a sufficient Si—O bands exist in the interface (back channel region) 100 of the a-Si layer 40/the silicon oxynitride film 90. The existence of the Si—O bonds in the upper interface region of the a-Si layer 40 causes the mismatch of the lattice constant to occur between the Si—Si bonds of the back channel region 100, so that many defects are generated in the back channel region 100. The increase of the defects means the increase of the Density of States in the back channel region 100. If the Density of States in the back channel region 100 is high, the electrons and the holes are captured or scattered by a lot of defects. For this reason, when the back gate voltage 120 is applied from the side of the channel passivation film 50, the external electric field is dissipated for putting the electron and the holes in and out a lot of defects. That is, the back channel region 100 is insusceptible to the effects of the external electric field, whereby the second feature of the present invention that the leakage current at the turn off state of the TFT due to the back channel effects can be suppressed is realized.

Figure 4:
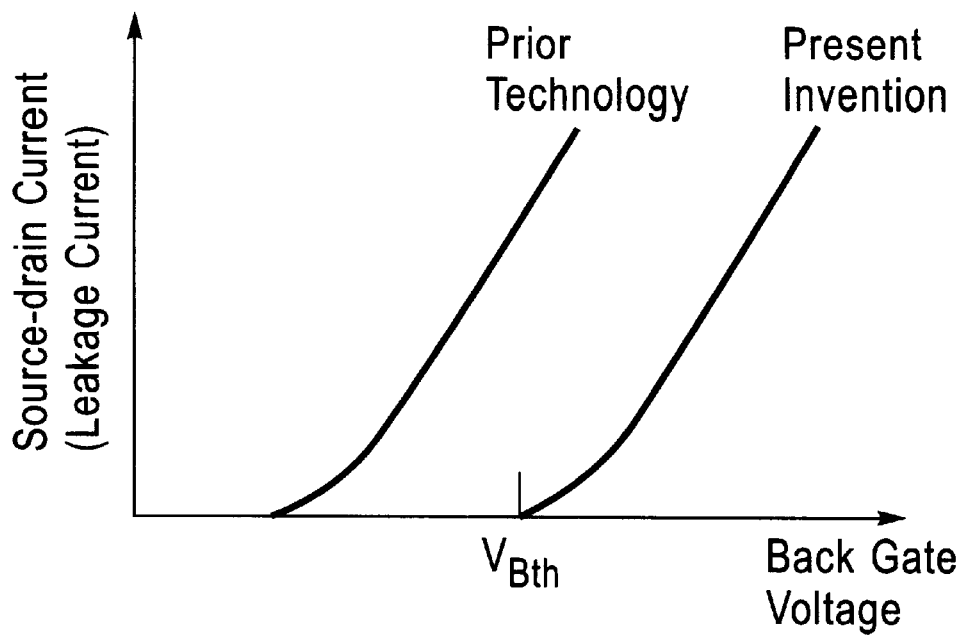
FIG. 4 shows the leakage currents (back channel voltage-current characteristics) in the TFT of the present invention and the prior TFT for the back gate voltage.

The reasons for suppressing the back channel effects in the present invention is described with reference to FIG. 4. FIG. 4 shows the leakage currents in the present invention and the prior technology flowing between the source electrode and the drain electrode for the back gate voltage 120. The TFT 3 of the present invention can provide a larger back gate threshold voltage $V_{Bth}$ than the back gate threshold voltage of the prior TFT 2 shown in FIG. 2D which uses only the silicon nitride film 50 as the channel passivation film.

Figure 2A:
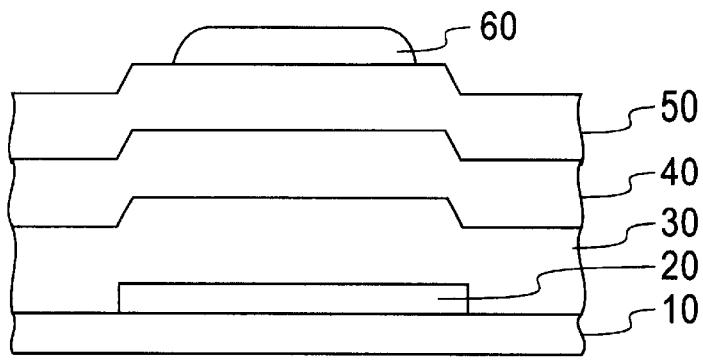
FIG. 2 shows a prior channel passivation film type TFT.
Figure 2B:
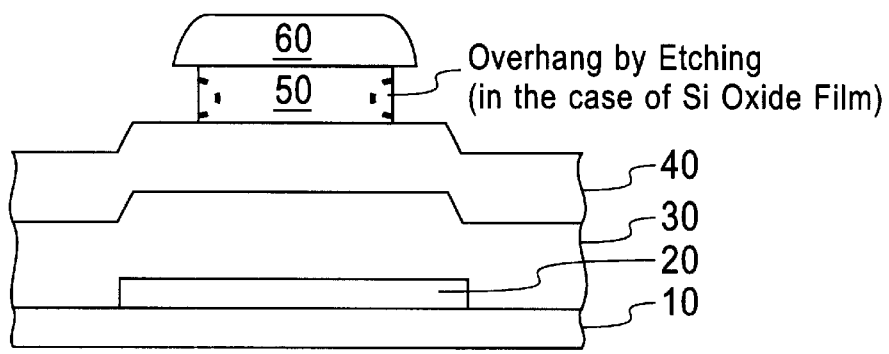
Figure 2C:
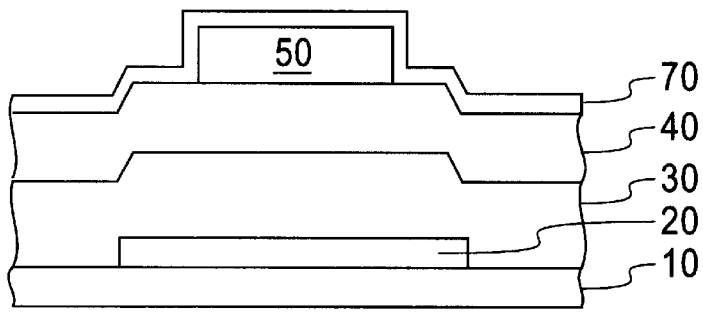
Figure 2D:
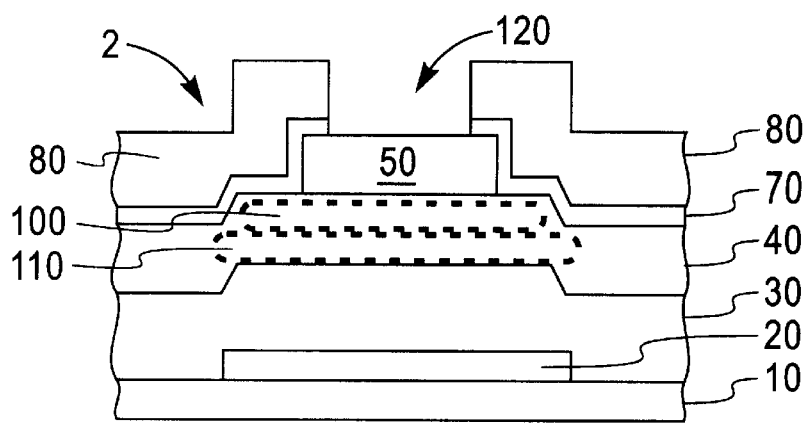
Figure 5:
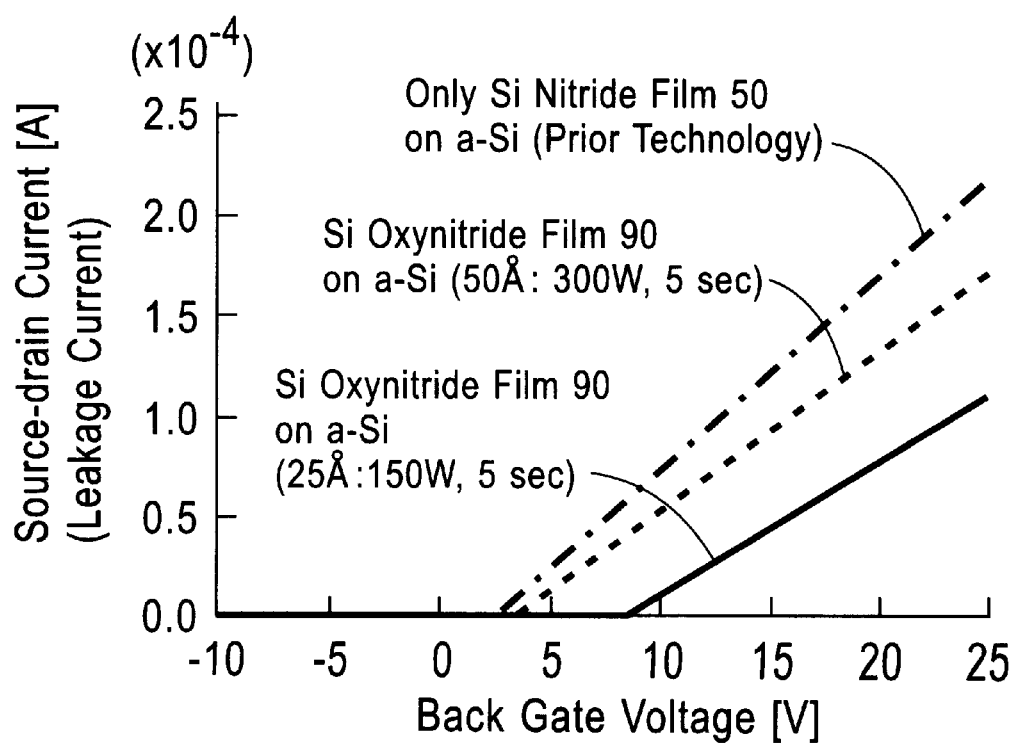
FIG. 5 shows the specific examples of the back channel voltage-current characteristics of the TFT 3 having the silicon oxynitride films of about 25 Å and about 50 Å of the present invention and the prior TFT 2.

The method for forming the thin silicon oxynitride film 90 which is a first feature of the present invention and the reasons for that the reduction of the thickness of the silicon oxynitride film 90 to the thickness equal to or less than 50 Å is preferable are described. In the step (a) of the present invention, the silicon oxynitride film 90 of a predetermined thickness is formed by controlling a plasma generating electric power and a film forming time in the plasma CVD method using the mixed gas containing $NO_2$. For example, the mixed gas contains $SiH_4$, $N_2$ and $NO_2$. FIG. 5 shows an example of the back channel voltage-current characteristics of the TFT 3 in the case that the silicon oxynitride films 90 of 25 Å and 50 Å are respectively formed on the a-Si layer 40 by the plasma of the mixed gas at the electric power of 150 W and 300 W during the film forming time of 5 seconds. To make the comparison, the leakage voltage-current characteristics of the prior inverted staggered TFT 2 of the channel passivation film type of the FIG. 2(d) is also shown in the FIG. 5. The parameters of the TFT 3 of the FIG. 3 of the present invention and the prior TFT 2 of the FIG. 2, such as the gate electrode 20, the gate insulating film 30, the a-Si film 40, the thickness of these films, etc. are substantially the same except the silicon oxynitride film 90 is formed in the TFT 3 of the present invention. The thickness of the silicon oxynitride film 90 is substantially proportional to the plasma forming electric power and the film forming time. Accordingly, the thickness of the silicon oxynitride film 90 on the a-Si layer 40 is about 25 Å and about 50 Å, respectively at the plasma forming electric powers of 150 W and 300 W. As shown in the FIG. 5, the largest threshold voltage $V_{Bth}$ of the back channel is obtained in the case that the thin silicon oxynitride film has the value of 25 Å. The inventors of the present invention has performed the experiment which is started from the formation of the silicon oxynitride film of the thickness 3000—by controlling the plasma forming electric power and the film forming time for the mixed gas. It has been experimentally confirmed that when the thickness of the silicon oxynitride film 90 is reduced to the thickness equal to or less than 50 Å, the remarkable effects for suppressing the back channel effects in comparison with the case of the prior TFT 2 is observed.

It is apparent from the above experimental results that the suppress of the back channel effects is realized by forming the thin silicon oxynitride film of the thickness equal to or less than 50 Å on the a-Si layer 40. The formation of the silicon oxynitride film 90 on the a-Si layer 40 causes the mismatch of the lattice to occur in the upper interface of the a-Si layer 40 due to the existence of the Si—O bonds. The mismatch of lattice in the interface region produces the effects for increasing the Density of States in the back channel region 100, as described before. Even if the thickness of the silicon oxynitride film 90 is thinner than 50 Å, it sufficiently increases the Density of States in the back channel region 100 of the underlying a-Si layer 40 (the second feature). The formation of the thin silicon oxynitride film 90 on the upper portion of the a-Si layer 40 results that the easy control of the etching process is realized since the a lot of Si—N bonds exist in the silicon oxynitride film 90 and the silicon nitride film 50 (the first feature). These features of the present invention realizes the uniform length of the channel of the TFT and the fabrication of the TFT which stably suppresses the back channel effects.

Further, a third feature of the present invention is that a threshold voltage $V_{Fth}$ of the front channel can be also controlled in addition to the increase of the threshold voltage $V_{Bth}$ of the back channel by forming the thin silicon oxynitride film 90 on the a-Si layer 40.

Figure 6A:
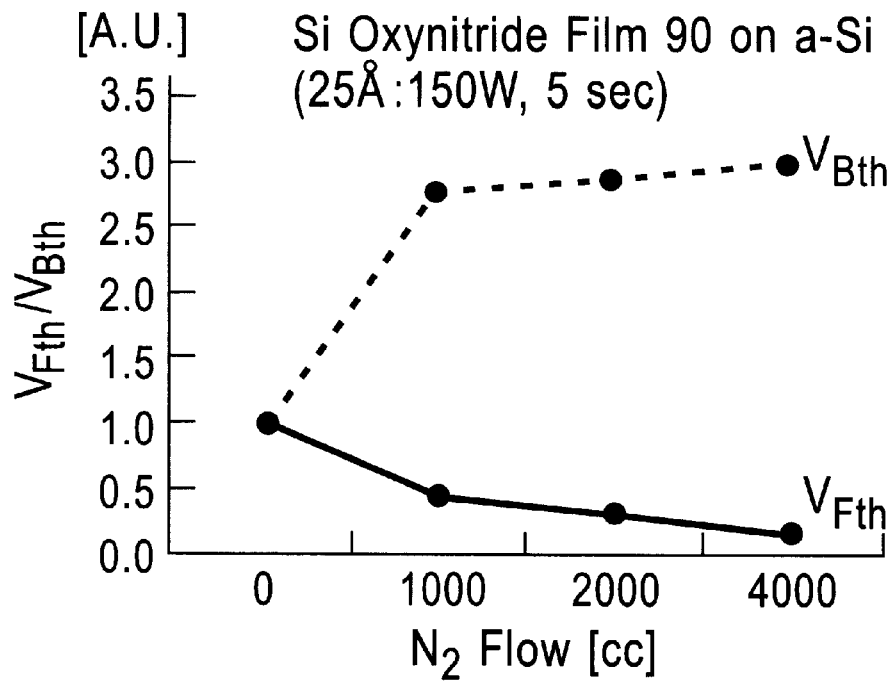
FIG. 6 shows variations of the front channel threshold voltage $V_{Fth}$ and the back channel threshold voltage $V_{Bth}$ of the TFT 3 having the silicon oxynitride film 90 formed by changing the flow rate of the $N_2$ of the mixed gas, wherein (a) and (b) indicate the voltage-current characteristics in the case that the thickness of the silicon oxynitride film 90 is about 25 Å and about 50 Å.
Figure 6B:
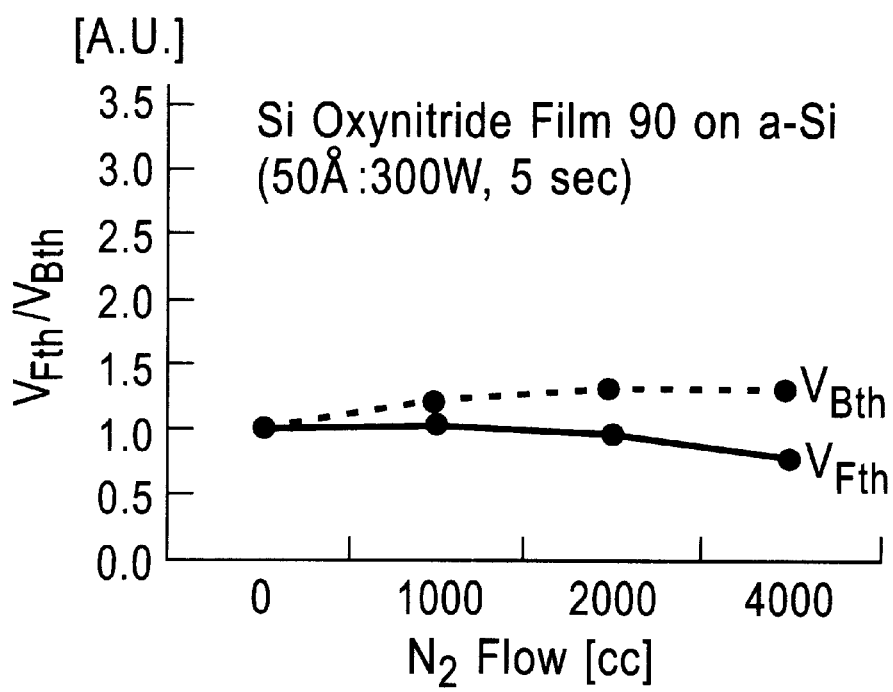

FIGS. 6A and 6B show the variation of the front channel threshold voltage $V_{Fth}$ and the back channel threshold voltage $V_{Bth}$ in the case that the formation of the silicon oxynitride film 90 is controlled by changing the flow rate of the $N_2$ contained in the mixed gas. The FIGS. 6A and 6B show the cases that the silicon oxynitride films 90 of the TFT are respectively formed by the CVD method using the plasma of the mixed gas at the electric power of 150 W and 300 W during the film forming time of 5 seconds, as in the case shown in the FIG. 5. The thickness of the silicon oxynitride films 90 of these TFTs are about 25 Å and about 50 Å, respectively. A vertical axis of the FIGS. 6A and B indicates Arbitrary Unit (A.U) in which the threshold voltage at the flow rate of the $N_2$=0 is defined as the reference value. In the case of the thin silicon oxynitride film 90 of 25 Å shown in the FIG. 6A, the value of the front channel threshold voltage $V_{Fth}$ is remarkably changes by changing the flow rate of the $N_2$ in comparison with the silicon oxynitride film 90 of 50 Å shown in the FIG. 6B. A wide selection of the front channel threshold voltage $V_{Fth}$ can be realized by forming the thin silicon oxynitride film 90 on the a-Si layer 40. As a result, the most suitable front channel threshold voltage $V_{Fth}$ for the design of the LCD, for example, can be selected by controlling the flow rate of the $N_2$ at the formation of the silicon oxynitride film 90 in the fabrication method of the TFT. In this fabrication method, it is possible to control the front channel threshold voltage $V_{Fth}$ of the TFT in addition to the suppress of the back channel effects. Accordingly, the present invention has the third feature that the fabrication of the TFT having the threshold voltage suitably controlled by a driver integrated circuit (IC) of the LCD becomes possible by controlling the flow rate of the $N_2$ at the formation of the silicon oxynitride film 90.

The specific embodiment of the present invention has been described. Changes in the specific embodiment can be made. For example, a Si layer can be used in place of the a-Si layer 40. Although the silicon nitride film is used as the channel passivation film 50, the silicon oxide film can be used. Although the use of the silicon oxide film degrades the control of the etching process, the back channel effects are considerably decreased.

Having thus described our invention, what we claim as new and desire to secure by Letters Patent is:

1. A thin film transistor having a gate electrode, a gate insulating film, a silicon layer and source and drain electrodes formed on an insulating substrate in this order comprising:

a silicon oxynitride film formed on said silicon layer on a back channel region between said source electrode and said drain electrode; and a channel passivation film formed on said silicon oxynitride film wherein said channel passivation film is a silicon nitride film.

2. A thin film transistor according to claim 1, wherein said silicon layer is an amorphous silicon layer.

3. A thin film transistor according to claim 1, wherein said silicon nitride film is sufficiently thicker than said silicon oxynitride film.

4. A thin film transistor according to claim 3, wherein a thickness of said silicon nitride film is about 500 Å.

5. A thin film transistor according to claim 4, wherein a thickness of said silicon oxynitride film is equal to or less than 50 Å.

6. A thin film transistor according to claim 3, wherein a thickness of said silicon oxynitride film is equal to or less than 50 Å.

7. A thin film transistor according to claim 6, wherein a thickness of said silicon oxynitride film is about 25 Å.

8. A thin film transistor according to claim 1, wherein said insulating substrate is glass.

* * * * *